(12) United States Patent
Hirosaki

(10) Patent No.: US 11,898,080 B2
(45) Date of Patent: Feb. 13, 2024

(54) PHOSPHOR, METHOD FOR PRODUCING SAME AND LIGHT EMITTING ELEMENT

(71) Applicant: National Institute for Materials Science, Ibaraki (JP)

(72) Inventor: Naoto Hirosaki, Ibaraki (JP)

(73) Assignee: National Institute for Materials Science, Tsukuba (JP)

(*) Notice: Subject to any disclaimer, the term of this patent is extended or adjusted under 35 U.S.C. 154(b) by 307 days.

(21) Appl. No.: 17/600,575

(22) PCT Filed: Mar. 16, 2020

(86) PCT No.: PCT/JP2020/011567
§ 371 (c)(1),
(2) Date: Sep. 30, 2021

(87) PCT Pub. No.: WO2020/203234
PCT Pub. Date: Oct. 8, 2020

(65) Prior Publication Data
US 2022/0177780 A1 Jun. 9, 2022

(30) Foreign Application Priority Data
Apr. 3, 2019 (JP) .................. 2019-071465

(51) Int. Cl.
*C09K 11/77* (2006.01)
*C01F 17/30* (2020.01)
*H01L 33/50* (2010.01)

(52) U.S. Cl.
CPC ........ *C09K 11/77348* (2021.01); *C01F 17/30* (2020.01); *C09K 11/77347* (2021.01);
(Continued)

(58) Field of Classification Search
CPC ........ C09K 11/77348; C09K 11/77347; C09K 11/77928; C09K 11/77927; C09K 11/08;
(Continued)

(56) References Cited

U.S. PATENT DOCUMENTS

2003/0020101 A1  1/2003  Hintzen et al.
2003/0024438 A1  2/2003  Hintzen et al.
(Continued)

FOREIGN PATENT DOCUMENTS

CN  102899038 A  1/2013
CN  108467733 A  8/2018
(Continued)

OTHER PUBLICATIONS

Krevel, van, J. W. H., PhD Thesis (2000). "On new rare-earth doped M-Si—Al—O—N materials: luminescence properties and oxidation resistance", Eindhoven: Eindhoven University of Technology (Netherlands), DOI: 10.6100/IR526594.
(Continued)

*Primary Examiner* — Elmito Breval
(74) *Attorney, Agent, or Firm* — Trojan Law Offices

(57) ABSTRACT

Provided is a phosphor which emits near-infrared light upon irradiation of visible light or ultraviolet light. A phosphor in an embodiment of the present invention includes an inorganic substance which contains at least an Eu element, an M[3] element (M[3] is at least one selected from the group consisting of Al, Y, La and Gd.), a Si element and nitrogen element, and also contains, if necessary, at least one element selected from the group consisting of M[1] element (M[1] is Li element.), an M[2] element (M[2] is at least one element selected from the group consisting of Mg, Ca, Ba and Sr.) and an oxygen element, while the phosphor has a maximum
(Continued)

value of an emission peak at a wavelength in the range of 760 nm or more and 850 nm and less upon irradiation by an excitation source.

19 Claims, 6 Drawing Sheets

(52) U.S. Cl.
CPC ........ H01L 33/502 (2013.01); *C01P 2002/30* (2013.01); *C01P 2002/70* (2013.01); *C01P 2006/60* (2013.01)

(58) Field of Classification Search
CPC ................... C01F 17/30; H01L 33/502; H01L 2933/0041; C01P 2002/30; C01P 2002/70; C01P 2006/60
See application file for complete search history.

(56) References Cited

U.S. PATENT DOCUMENTS

| | | | |
|---|---|---|---|
| 2007/0007494 A1 | 1/2007 | Hirosaki et al. | |
| 2007/0018567 A1 | 1/2007 | Hirosaki | |
| 2007/0108896 A1 | 5/2007 | Hirosaki | |
| 2008/0265748 A1 | 10/2008 | Hirosaki | |
| 2009/0129052 A1 | 5/2009 | Hirosaki | |
| 2009/0153028 A1 | 6/2009 | Hirosaki | |
| 2009/0166584 A1* | 7/2009 | Shimooka | C09K 11/77347 252/301.4 F |
| 2011/0175519 A1 | 7/2011 | Hirosaki | |
| 2012/0099291 A1 | 4/2012 | Hirosaki | |
| 2013/0168606 A1 | 7/2013 | Hirosaki et al. | |
| 2015/0275082 A1 | 10/2015 | Hirosaki et al. | |
| 2017/0283261 A1 | 10/2017 | Hirosaki et al. | |
| 2019/0127638 A1 | 5/2019 | Hirosaki et al. | |

FOREIGN PATENT DOCUMENTS

| | | |
|---|---|---|
| CN | 108630794 A | 10/2018 |
| CN | 109370587 A | 2/2019 |
| JP | 3837551 B | 10/2006 |
| WO | 2014067433 A1 | 5/2014 |

OTHER PUBLICATIONS

Y. Q. Li, G. de With, H. T. Hintzen, "Luminescence properties of Ce3+-activated alkaline earth silicon nitride M2SisNs (M=Ca, Sr, Ba) materials". Elsevier, Journal of Luminescence, 116 (2006), I 07-116.

Preparation and Luminescence Properties of Several Nitrogen (Oxygen) based Luminescent Materials for (Near) Ultraviolet White LED, Wang Chuang, Chinese Doctoral Dissertation Full Text Database Basic Science Series, vol. 8, 2016, pp. 63-81.

Study on Luminescence Properties of Red Phosphor for White LED, Tang'an, pp. 24-25, Intellectual Property Publishing House, Aug. 31, 2016.

China National Intellectual Property Administration Office Action in corresponding patent application No. CN 202080026537.9 for "Phosphor, Method for Producing Same and Light Emitting Element".

* cited by examiner

PHOSPHOR, METHOD FOR PRODUCING SAME AND LIGHT EMITTING ELEMENT

TECHNICAL FIELD

The present disclosure relates to a phosphor that emits near-infrared light upon irradiation of visible light or an ultraviolet ray, a method for producing the same, and a light-emitting element using the phosphor.

BACKGROUND ART

In recent years, a white color light-emitting diode has been replacing an incandescent lamp bulb and a fluorescent lamp with respect to illumination. The white color light-emitting diode is configured by combining a blue light emitting diode (hereinafter referred to as "LED") and a phosphor that converts blue light into yellow or red light. As a phosphor for this purpose, for example, phosphors of Patent References 1 and 2 are known.

Further, in an application of a liquid crystal backlight, the illumination is configured by combining a blue LED, a red phosphor, and a green phosphor having a sharp spectrum. As a green phosphor for this application, a phosphor including europium (hereinafter referred to as Eu) in p-type sialon is known (for example, refer to Patent Reference 3). As a phosphor to which Ce is added, a blue phosphor having a JEM phase ($LaAl(Si_{6-z}Al_z)N_{10-z}O_z$) as a host crystal is known (Patent Reference 4). As a red light-emitting substance, a phosphor in which Eu is added to $Ba_2Si_5N_8$ or $Sr_2Si_5N_8$ is known (Patent Reference 5 and Non-Patent Reference 1). Further, blue, green, and yellow light-emitting phosphors, in which Li and Ce are added to $M_2Si_5N_8$ (M=Ca, Sr, Ba) are known (Non-Patent Reference 2).

As a lamp other than an incandescent lamp and a fluorescent lamp, a halogen lamp and a xenon lamp are known. These lamps are characterized by emitting a near-infrared light component having a wavelength of 760 nm or more in addition to light in a visible region having a wavelength from 380 nm to 760 nm. Therefore, these lamps are still used as a light source for industrial equipment such as a spectrometric analysis device using the near-infrared light such that the LED has not been replacing them so progressively.

Since the conventional white LED has been used in a monitor application and a general lighting application for household use, the phosphor to be used is a material that emits light in a visible range from 380 nm to 760 nm, and materials that emit near infrared light have not been considered. While a phosphor having divalent Eu, in particular, as a light-emitting ion is known to emit ultraviolet, blue, green, yellow, or red light, however, a material that emits near infrared light or the like having a wavelength of 760 nm or more has not been known.

Prior Art References
Patent References

[Patent Reference 1] Japanese Patent No. 3837551, Specification.
[Patent Reference 2] Japanese Patent No. 3837588, Specification.
[Patent Reference 3] Japanese Patent No. 3921545, Specification.
[Patent Reference 4] International Publication No. WO 2005/019376.
[Patent Reference 5] European Patent Publication EP1104799A1.

NON-PATENT REFERENCES

[Non Patent Reference 1] Krevel, van, J. W. H. (2000) "On new rare-earth doped M-Si—Al—O—N materials: luminescence properties and oxidation resistance," Ph.D. thesis, Technische Universiteit Eindhoven, the Netherlands.
[Non Patent Reference 2] Y. Q. Li; G. de With; H. T. Hintzen, "Luminescence properties of $Ce^{3+}$-activated alkaline earth silicon nitride $M_2Si_5N_8$ (M=Ca, Sr, Ba) materials," Journal of Luminescence 116 (2006) 107-116, Elsevier.

SUMMARY OF THE INVENTION

Problem to be Solved by the Invention

In an embodiment of the present invention, a phosphor that emits light having a wavelength of 760 nm or more when irradiated with ultraviolet light or visible light in order to cause a white LED to have an additional function to emit light in a near infrared region may be provided. Further, a manufacturing method thereof and a phosphor conversion LED (a lighting device with a combination of a phosphor and a monochromatic LED) utilizing such a phosphor my be provided.

Means to Solve the Problem

Under such circumstances, after the present inventor has been investigating a nitride or an oxynitride containing an Eu element, an M[1] element (M[1] is Li.), an M[2] element (M[2] is Mg, Ca, Ba, or Sr.), an M[3] element (M[3] is Al, Y, La, or Gd.), a Si element, a nitrogen element, and an oxygen element intensively, it was found that a compound having a specific composition region range, a specific solid-solution state, and a specific crystal phase could become a phosphor to emit light having a peak at a wavelength in a range from 760 nm to 850 nm. And as a method of manufacturing such a phosphor, it was found to synthesize such a phosphor by mixing raw materials selected from a nitride or an oxide of the Eu element, a nitride or an oxide of the M[3] element, a nitride of the Si element, and, if necessary, a nitride or an oxide of the M[1] element, a nitride or an oxide of the M[2] element, and an oxide of the Si element and heating the mixed raw materials. Further, it was found that a solid state device to emit light having a near-infrared component could be provided by combining such a phosphor and a light-emitting diode of ultraviolet, blue, or visible light. These configurations are as described below.

In an embodiment of the present invention, a phosphor may contain an inorganic substance including at least an Eu element, an M[3] element (M[3] is at least one kind of element selected from the group consisting of Al, Y, La, and Gd.), a Si element, a nitrogen element, and, if necessary, at least one kind of element selected from a group consisting of an M[1] element (M[1] is a Li element.), an M[2] element (M[2] is at least one kind of element selected from a group consisting of Mg, Ca, Ba, and Sr.), and an oxygen element and emit light having a local maximum value of a emission peak at a wavelength in a range of 760 nm or more and 850 nm or less upon irradiation by an excitation source.

The above inorganic substance may be represented by a composition of $M[1]_a Eu_b M[2]_c M[3]_d Si_e O_f N_g$ (where a+b+c+d+e+f+g=1) and the parameters a, b, c, d, e, f, and g may be represented by values respectively satisfying:

$0 \le a \le 0.01$,
$0.006 \le b \le 0.15$,
$0 \le c \le 0.15$,
$0.001 \le d \le 0.07$,
$0.3 \le e \le 0.35$,
$0 \le f \le 0.05$, and
$0.5 \le g \le 0.56$.

The above inorganic substance may be represented by a composition of $M[1]_a Eu_b M[2]_c M[3]_d Si_e O_f N_g$ (where a+b+c+d+e+f+g=1) and the parameters a, b, c, d, e, f, and g may be represented by values respectively satisfying:

a=0

$0.006 \leq b \leq 0.13$, $0 \leq c \leq 0.12$, $0.0019 \leq d \leq 0.07$, $0.3 \leq e \leq 0.35$, f=0, and $0.53 \leq g \leq 0.56$.

The above-mentioned inorganic substance may be represented by a composition of $(Eu, M[2])_x M[3]_y Si_5 N_8$ where x=2−1.5y and $0.1 \leq y \leq 0.5$.

The above inorganic substance may have the same crystal structure as any one of $Eu_2Si_5N_8$, $Ca_2Si_5N_8$, $Sr_2Si_5N_8$, or $Ba_2Si_5N_8$.

The M[2] element may be contained.

The M[3] element may be La single metal.

The above-mentioned M[3] element may contain at least La, and the above-mentioned La may be contained in a range of 0.19 at % or more to 7 at % or less.

The above-mentioned Eu element may be contained in an amount of 0.6 at % or more.

The above-mentioned inorganic substance may be represented by $Eu_2Si_5N_8$: La.

The above-mentioned inorganic substance may be represented by $Sr_2Si_5N_8$: Eu, La.

The above-mentioned inorganic substance may be represented by $Ba_2Si_5N_8$: Eu, La.

The above-mentioned excitation source may be light having a wavelength in a range of 300 nm or more and 600 nm or less.

The above-mentioned excitation source may be light having a wavelength in a range of 300 nm or more and 600 nm or less, and the phosphor may emit fluorescence having a spectral shape in which an emission intensity at 630 nm upon irradiation of the light is equal to or less than one-half of an intensity of emission of a maximum value wavelength in a range of 760 nm or more and 850 nm or less.

In an embodiment of the present invention, a manufacturing method of the above-mentioned phosphor may include mixing a nitride or an oxide of the Eu element, a nitride or an oxide of the M[3] element, a nitride of the Si element, and, if necessary, at least one raw material selected from a group consisting of a nitride or an oxide of the M[1] element, a nitride or an oxide of the M[2] element, and an oxide of the Si element; and firing the thus-mixed raw material at a temperature in a range of 1400 degrees Celsius (° C.) or higher and 2200° C. or lower. In such a way, the above-mentioned problem may be solved.

In an embodiment of the present invention, with respect to a light emitting element including a phosphor and an excitation source, the excitation source may emit light having a wavelength in a range of 300 nm or more and 600 nm or less and the phosphor may contain at least the above-mentioned phosphor.

The excitation source may be a light emitting diode (LED) or a laser diode (LD).

One or more other phosphors, which emit fluoresce having a maximum value (peak) at a wavelength in a range of 400 nm or more and less than 760 nm upon irradiation by the excitation source, may be further included.

The one or more other phosphors may be selected from a group consisting of α-sialon: Ce, β-sialon: Eu, α-sialon: Eu, $CaAlSiN_3$: Ce, and (Ca, Sr)$AlSiN_3$: Eu, respectively.

The phosphors may emit fluorescence exhibiting a spectral shape, in which a minimum value of the emission intensity is at least one-fifth (⅕) of a maximum value thereof in a wavelength range of 520 nm or more and 850 nm or less.

Effect of the Invention

In an embodiment of the present invention, an phosphor emits fluorescence exhibiting a local maximum value of an emission peak at a wavelength in a range of 760 nm or more and 850 nm or less upon irradiation by the excitation source as the phosphor has a composition comprising an Eu element, an M[3] element (where M[3] is one or two or more kinds of elements selected from a group consisting of Al, Y, La, and Gd), a Si element, a nitrogen element such that the phosphor is excellent as a phosphor to be used for the lamp that requires a component of near-infrared light.

EMBODIMENT FOR CARRYING OUT THE INVENTION

Figure 1:
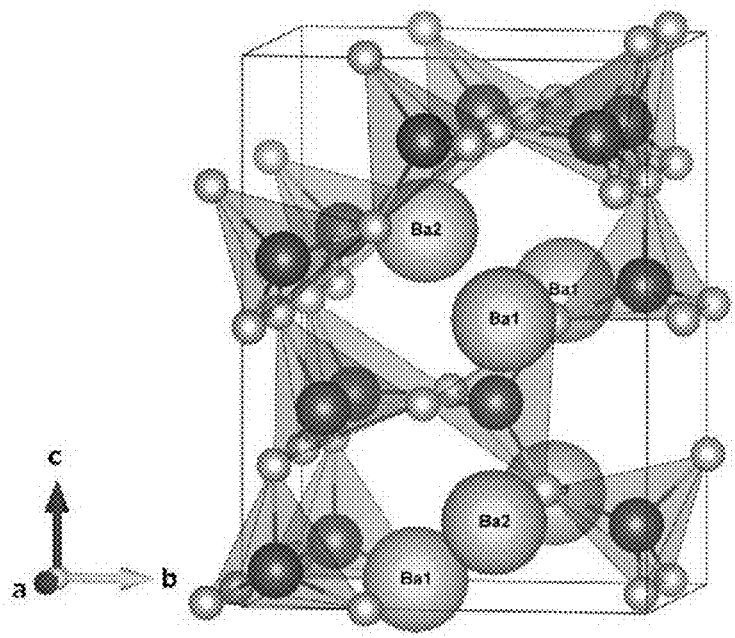
FIG. 1 is a diagram illustrating a crystal structure of $Ba_2Si_5N_8$ crystal.
Figure 2:
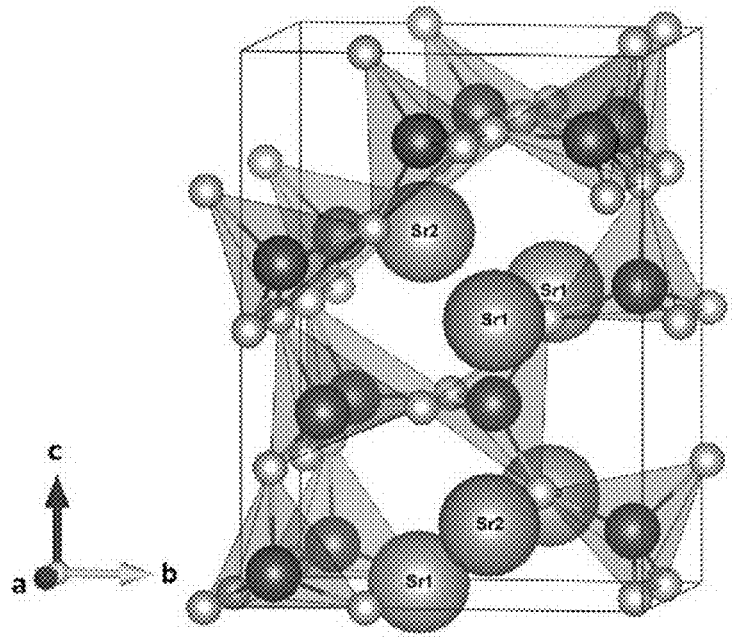
FIG. 2 is a diagram illustrating a crystal structure of $Sr_2Si_5N_8$ crystal.
Figure 3:
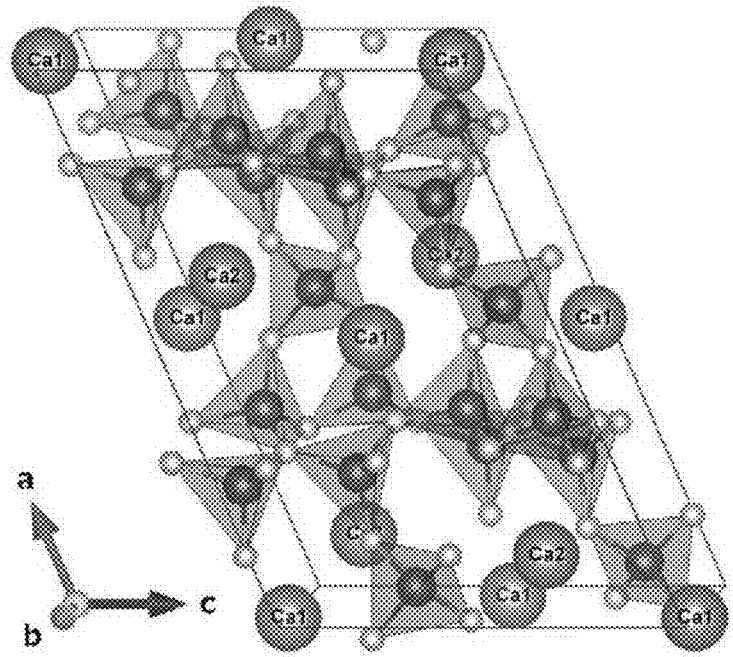
FIG. 3 is a diagram illustrating a crystal structure of $Ca_2Si_5N_8$ crystal.
Figure 4:
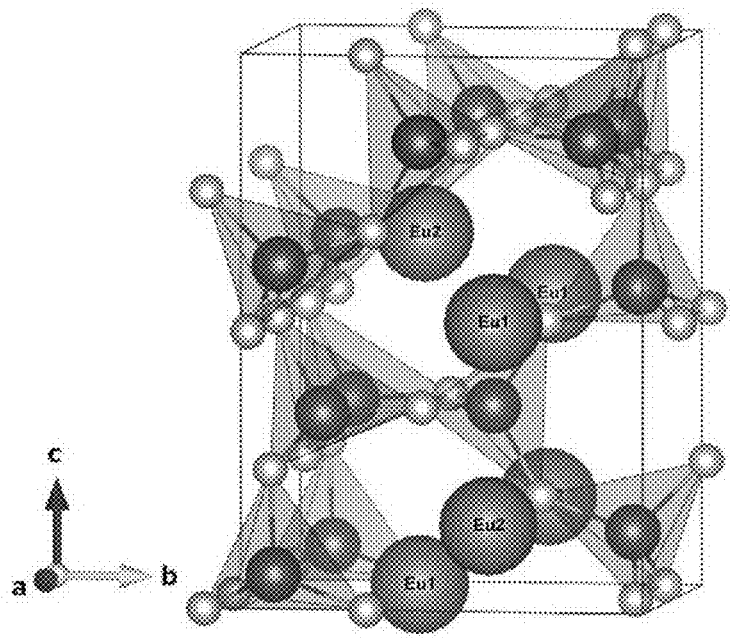
FIG. 4 is a diagram illustrating a crystal structure of $Eu_2Si_5N_8$ crystal.

Hereafter, details will be explained in embodiments of the present invention.

In an embodiments of the present invention, a phosphor includes at least an inorganic substance including at least an Eu element, an M[3] element (M[3] is one or two or more kinds of elements selected from the group consisting of Al, Y, La, and Gd), a Si element, and a nitrogen element, and, if necessary, including at least one kind of element selected from the group consisting of an M [1] element (M[1] is a Li element), an M[2] element (M[2] is a mixture of at least one element selected from the group consisting of Mg, Ca, Ba, and Sr), and an oxygen element. With such a composition, when irradiated by the excitation source, fluorescence having a local maximum value of an emission peak thereof could be emitted at a wavelength in the range of 760 nm or more and 850 nm or less. If the composition of the inorganic substance is out of this range, the intensity of fluorescence in the range of 760 nm or more and 850 nm or less may be decreased. As the excitation source, an ultraviolet ray, visible light, an electron beam, an X-ray and the like can be utilized, but light having a wavelength of 300 nm to 600 nm emitted by a solid-state illuminating element such as a light-emitting diode (LED) and a laser diode (LD) may be utilized. Such an excitation source is preferable because it has high excitation efficiency.

In an embodiment of the present invention, a phosphor including an organic substance in the present invention may be represented by a composition formula of $M[1]_a Eu_b M[2]_c M[3]_d Si_e O_f N_g$ (where a+b+c+d+e+f+g=1) and the parameters a, b, c, d, e, f, and g may satisfy:

$0 \leq a \leq 0.01$,
$0.006 \leq b \leq 0.15$,
$0 \leq c \leq 0.15$,
$0.001 \leq d \leq 0.07$,
$0.3 \leq e \leq 0.35$,
$0 \leq f \leq 0.05$, and
$0.5 \leq g \leq 0.56$ such that it is likely that an emission intensity thereof in particular may be high in the range of 760 nm or more and 850 nm or less. Here, M[1] and oxygen may or may not be included in the inorganic substance.

In particular, it is likely that, if the parameters are represented by numerical values satisfying the following condition:

a=0,
$0.006 \leq b \leq 0.13$,
$0 \leq c \leq 0.12$,
$0.0019 \leq d \leq 0.07$,
$0.3 \leq e \leq 0.35$,
f=0, and
$0.53 \leq g \leq 0.56$, an emission intensity thereof may be even higher in the range of 760 nm or more and 850 nm or less. Here, M[1] and oxygen may or may not be included in the inorganic substance.

The 'a' may be a parameter indicating a content of the univalent M[1] element and may be in the range of:
$0 \leq a \leq 0.01$.
It appears that the crystal may be stabilized by the M[1] element, which may achieve an adjustment effect of the valence when the trivalent M[3] element substitutes the Eu element or the M[2] element, each of which is a divalent element. When the M[1] element is not added, it is possible that the electric charge may be adjusted by causing the Eu or M[2] element or the Si element to be partially deficient in substituting the Eu or M[2] element with the M[3] element such that it is not necessary to include the M[1] element. If the parameter a exceeds 0.01, the stability of the crystal structure may be impaired such that the emission intensity may be decreased.

The 'b' is a parameter indicating a content of the Eu element and may be in the range of:
$0.006 \leq b \leq 0.15$
If the parameter b is out of the range, light may not be emitted in the range of 760 nm or more and 850 nm or less. More preferably, the parameter may be in the range of:
$0.006 \leq b \leq 0.13$ and
the emission intensity seems to be even higher.

The 'c' is a parameter indicating a content of the divalent M[2] element and may be in the range of:
$0 \leq c \leq 0.15$
The M[2] element is an optional element, but if the value is out of this range, the stability may be impaired such that the emission intensity may be decreased.
More preferably, the parameter c may be in the range of:
$0 \leq c \leq 0.12$ and
it seems that the emission intensity may be even higher.

The 'd' is a parameter indicating a content of the trivalent M[3] element and may be in the range of:
$0.001 \leq d \leq 0.07$.
If it is less than 0.001, it tends to cause the phosphor to emit fluorescence in the wavelength range from 600 nm to 700 nm, which corresponds to an emission color of $M[2]_2Si_5N_8$:Eu such that it is threatened that the fluorescence may not have an emission color in the range of 760 nm or more and 850 nm or less. If it exceeds 0.07, the stability of the crystal structure may be impaired such that the emission intensity may be decreased.
More preferably, the parameter d may be in the range of:
$0.0019 \leq d \leq 0.07$ and
it seems that the emission component in the range of 760 nm or more and 850 nm or less may be higher.
More preferably, it may be in the range of:
$0.0019 \leq d \leq 0.04$.

The 'e' is a parameter indicating a content of the Si element and may be in the range of:
$0.3 \leq e \leq 0.35$.
If it is out of the range, the stability of the crystal structure may be impaired such that it is threatened that the emission intensity may be decreased.

The 'f' is a parameter indicating a content of oxygen and may be in the range of:
$0 \leq e \leq 0.05$.
Although oxygen is not an essential element, the oxygen is generally included in the nitride raw material such that it may be incorporated into the material. In this case, the content of oxygen may be 0.05 or less. If it is out of this range, the stability of the crystal structure is impaired such that the emission intensity may be decreased. It appears that a material with f=0 may have particularly high emission intensity.

The 'g' is a parameter indicating a content of nitrogen and may be in the range of:
$0.5 \leq g \leq 0.56$.
If it is out of this range, the stability of the crystal structure is impaired such that the emission intensity may be decreased.
More preferably, the parameter g may be in the range of:

$0.53 \leq g \leq 0.56$ and it seems that the emission intensity may be in particular high.

A phosphor including an inorganic substance that is represented by $(Eu, M[2])_x M[3]_y Si_5 N_8$, where x=2−1.5y and $0.1 \leq y \leq 0.5$, appears to exhibit a high emission intensity particularly in the range of 760 nm or more and 850 nm or less. If the M[3] element is included in the crystal with an amount corresponding to the case of $0.1 \leq y \leq 0.5$, it appears that the emission wavelength may shift longer such that an emission component in the wavelength range of 760 nm or more and 850 nm or less may be increased. If the parameter y is less than 0.1, the effect of shifting the wavelength longer may be less and if it is more than 0.5, a second phase may be yielded because some may not be incorporated into the crystal such that the emission intensity may be lowered. If the M[3] element partially substitutes the Eu and M[2] elements in the $(Eu, M[2])_2 Si_5 N_8$ crystal, the total electric charge may not be neutral. As one of the methods for adjusting it, there is a method of making an inorganic substance have a composition in which the content of Eu and M[2] is represented by the formula of x=2−1.5y. It appears that the electric neutrality may be easily maintained and that the crystal structure may be so stabilized that the emission intensity may be improved by making it have such a composition. Here, if (Eu, M[2])$_x$M[3]$_y$Si$_5$N$_8$ is expressed by y, it may be expressed in a way of (Eu, M[2])$_{2-1.51y}$M[3]$_y$Si$_5$N$_8$ and if it is normalized, it may be expressed in a way of (Eu, M[2])$_{(2-1.5y)/(15-0.5y)}$M[3]$_{y/(15-0.5y)}$Si$_{5/(15-0.5y)}$N$_{8/(15-0.5y)}$. Since 0.1≤y≤0.5, for example, (Eu, M[2])$_{0.1237}$M[3]$_{0.00669}$Si$_{0.3344}$N$_{0.5351}$, (Eu, M[2])$_{0.1141}$M[3]$_{0.01342}$Si$_{0.3356}$N$_{0.5369}$, (Eu, M[2])$_{0.1044}$M[3]$_{0.02020}$Si$_{0.3367}$N$_{0.5387}$, (Eu, M[2])$_{0.09459}$M[3]$_{0.02703}$Si$_{0.3378}$N$_{0.5405}$, and (Eu, M[2])$_{0.08475}$M[3]$_{0.03390}$Si$_{0.3390}$N$_{0.5424}$, etc. may be examples thereof.

Here again, it should be noted that, in the formula represented by (Eu, M[2])$_2$Si$_5$N$_8$, the M[2] element is an optional element. Further, (Eu, M[2]) may mean that the Eu element and the M[2] element are located in equivalent sites in the crystal structure to be described later with any composition including even the case where the amount of M[2] is 0 (zero). Specifically, if the conditions of 0.006≤b≤0.15 with respect to Eu and 0≤c≤0.15 with respect to M[2] are satisfied, the range from Eu$_{0.006}$M[2]$_{0.1177}$ to Eu$_{0.1237}$ with respect to (Eu, M[2])$_{0.1237}$ and the range from Eu$_{0.006}$M[2]$_{0.07874}$ to Eu$_{0.08475}$ with respect to (Eu, M[2])$_{0.08475}$ may apply.

It appears that a phosphor including an inorganic substance having the same crystal structure as any one of Ba$_2$Si$_5$N$_8$, Sr$_2$Si$_5$N$_8$, Ca$_2$Si$_5$N$_8$, and Eu$_2$Si$_5$N$_8$ may be characterized in that an emission intensity thereof is high particularly in the range of 760 nm or more and 850 nm or less. Here, the same crystal structure may include those that have exactly the same space group, the same lattice constants, and the same atomic positions of the crystals as shown in Tables 1 to 4 and those that have the space group and the lattice constants changed since the atomic positions are shifted within 5% from the original atomic positions by the solid solution of different elements. For example, if the length of the chemical bond (distance between neighboring atoms) calculated from the lattice constants and the atomic coordinates obtained by performing a Rietbelt analysis of the results of X-ray diffraction and neutron diffraction in the space groups as shown in Tables 1 to 4 matches the length of the chemical bond calculated from the lattice constants and the atomic coordinates as shown in Tables 1 to 4 within ±5%, it can be said that they have the same crystal structure. As a simple method, it can be said that they have the same crystal structure in the case where they show the same diffraction patterns and their lattice constants match within 5%.

Here, the crystal structure parameters of Ba$_2$Si$_5$N$_8$, Sr$_2$Si$_5$N$_8$, Ca$_2$Si$_5$N$_8$, and Eu$_2$Si$_5$N$_8$ are shown in Tables 1 to 4, respectively. Further, these crystal structure models are shown in FIGS. 1 to 4, respectively. In these figures, each atom arranged at each center of each tetrahedron is Si, and each atom arranged at each vertex of each tetrahedron is N. As shown in Tables 1, 2, and 4, any one of Ba$_2$Si$_5$N$_8$, Sr$_2$Si$_5$N$_8$, and Eu$_2$Si$_5$N$_8$ is a crystal of the orthorhombic crystal system having a space group of Pmn2$_1$ and their lattice parameters a, b, and c respectively match within 5% relative error. And their inorganic substances have the isomorphic crystal such that it is considered that their solid solution at any ratio is possible.

TABLE 1

Crystal structure parameters of Ba$_2$Si$_5$N$_8$ crystal

| Crystal composition | | Ba$_2$Si$_5$N$_8$ | |
|---|---|---|---|
| ICSD # | | 401501 | |
| Space group | | Pmn21 | |
| Space group number | | 31 | |
| Lattice constants | a | 5.783(1) | Å |
| | b | 6.959(1) | Å |
| | c | 9.391(2) | Å |
| | α | 90 | Degree |
| | β | 90 | Degree |
| | γ | 90 | Degree |

| | Atomic coordinates | | | Site |
|---|---|---|---|---|
| Atoms | x | y | z | occupancy rate |
| Ba1 | 0 | 0.85444(7) | 0 | 1 |
| Ba2 | 0 | 0.87881(6) | 0.63251(6) | 1 |
| Si1 | 0.25087(24) | 0.66378(16) | 0.32069(31) | 1 |
| Si2 | 0 | 0.05224(25) | 0.3228(4) | 1 |
| Si3 | 0 | 0.41854(40) | 0.53883(30) | 1 |
| Si4 | 0 | 0.39962(36) | 0.10357(29) | 1 |
| N1 | 0 | 0.1968(10) | 0.47209(84) | 1 |
| N2 | 0.23918(91) | 0.90630(61) | 0.33060(77) | 1 |
| N3 | 0.24684(84) | 0.44764(55) | 0.99298(51) | 1 |
| N4 | 0 | 0.57656(86) | 0.23459(61) | 1 |
| N5 | 0 | 0.1736(12) | 0.16462(86) | 1 |
| N6 | 0 | 0.42233(96) | 0.72949(66) | 1 |

TABLE 2

Crystal structure parameters of Sr$_2$Si$_5$N$_8$ crystal

| Crystal composition | | Sr$_2$Si$_5$N$_8$ | |
|---|---|---|---|
| ICSD # | | 401500 | |
| Space group | | Pmn21 | |
| Space group number | | 31 | |
| Lattice constants | a | 5.710(1) | Å |
| | b | 6.822(1) | Å |
| | c | 9.341(2) | Å |
| | α | 90 | Degree |
| | β | 90 | Degree |
| | γ | 90 | Degree |

| | Atomic coordinates | | | Site |
|---|---|---|---|---|
| Atoms | x | y | z | occupancy rate |
| Sr1 | 0 | 0.86945(16) | 0 | 1 |
| Sr2 | 0 | 0.88164(15) | 0.36863(9) | 1 |
| Si1 | 0.25176(18) | 0.66693(14) | 0.68358(33) | 1 |
| Si2 | 0 | 0.05493(23) | 0.67711(46) | 1 |
| Si3 | 0 | 0.41958(47) | 0.46192(38) | 1 |
| Si4 | 0 | 0.40135(47) | 0.90228(36) | 1 |
| N1 | 0 | 0.1909(13) | 0.5204(12) | 1 |
| N2 | 0.24781(66) | 0.91217(48) | 0.67282(91) | 1 |
| N3 | 0.24888(68) | 0.44434(52) | 0.01051(46) | 1 |
| N4 | 0 | 0.58719(85) | 0.77345(59) | 1 |
| N5 | 0 | 0.1715(15) | 0.8355(12) | 1 |
| N6 | 0 | 0.42701(87) | 0.27224(56) | 1 |

TABLE 3

Crystal structure parameters of Ca$_2$Si$_5$N crystal

| Crystal composition | | Ca$_2$Si$_5$N$_8$ | |
|---|---|---|---|
| ICSD # | | 79070 | |
| Space group | | C1c1 | |
| Space group number | | 9 | |
| Lattice constants | a | 14.352(3) | Å |
| | b | 5.610(1) | Å |
| | c | 9.689(2) | Å |

TABLE 3-continued

Crystal structure parameters of $Ca_2Si_5N$ crystal

| | α | 90 | Degree |
|---|---|---|---|
| | β | 112.06(3) | Degree |
| | γ | 90 | Degree |

| Atoms | Atomic coordinates | | | Site occupancy rate |
|---|---|---|---|---|
| | x | y | 1 | |
| Ca1 | 0 | 0.7637(3) | 0 | 1 |
| Ca2 | 0.6112(1) | 0.7457(2) | 0.2000(8) | 1 |
| Si1 | 0.0581(2) | 0.8055(2) | 0.3539(2) | 1 |
| Si2 | 0.7557(1) | 0.2097(3) | 0.3182(2) | 1 |
| Si3 | 0.7545(1) | 0.4966(4) | 0.0631(2) | 1 |
| Si4 | 0.3627(1) | 0.2078(4) | 0.3681(2) | 1 |
| Si5 | 0.8552(2) | 0.0027(4) | 0.1264(2) | 1 |
| N1 | 0.9866(5) | 0.638(1) | 0.4289(6) | 1 |
| N2 | 0.1286(4) | 0.009(1) | 0.9959(5) | 1 |
| N3 | 0.7959(2) | 0.2424(6) | 0.1702(3) | 1 |
| N4 | 0.8027(3) | 0.7484(6) | 0.1752(3) | 1 |
| N5 | 0.9798(3) | 0.999(1) | 0.2178(6) | 1 |
| N6 | 0.8335(2) | 0.0145(5) | 0.9349(4) | 1 |
| N7 | 0.6309(5) | 0.157(1) | 0.2732(7) | 1 |
| N8 | 0.7960(3) | 0.4826(6) | 0.4161(3) | 1 |

TABLE 4

Crystal structure parameters of $Eu_2Si_5N_8$ crystal

| Crystal composition | | $Eu_2Si_5N_8$ | |
|---|---|---|---|
| ICSD # | | 59257 | |
| Space group | | Pmn21 | |
| Space group number | | 31 | |
| Lattice constants | a | 5.7094(4) | Å |
| | b | 6.8207(4) | Å |
| | c | 9.3291(6) | Å |
| | α | 90 | Degree |
| | β | 90 | Degree |
| | γ | 90 | Degree |

| Atoms | Atomic coordinates | | | Site occupancy rate |
|---|---|---|---|---|
| | x | y | z | |
| Eu1 | 0 | 0.11625(6) | 0.93665(3) | 1 |
| Eu2 | 0 | 0.12862(6) | 0.57044(3) | 1 |
| Si1 | 0 | 0.5810(4) | 0.0297(3) | 1 |
| Si2 | 0 | −.0548(2) | 0.2460(4) | 1 |
| Si3 | 0.5 | 0.4028(4) | 0.9704(3) | 1 |
| Si4 | 0.7480(2) | 0.33361(14) | 0.2514(3) | 1 |
| N1 | 0 | 0.8114(10) | 0.091(1) | 1 |
| N2 | 0.5 | 0.1733(12) | 0.9085(9) | 1 |
| N3 | 0.7519(6) | 0.0876(5) | 0.2385(7) | 1 |
| N4 | 0.7484(7) | 0.4452(5) | 0.0786(4) | 1 |
| N5 | 0 | 0.4152(9) | 0.3405(6) | 1 |
| N6 | 0.5 | 0.4264(9) | 0.3403(6) | 1 |

A phosphor including no M[2] element seems to have many emission components in the range of 800 nm or more and 850 nm or less, thereby being preferable as a phosphor for near infrared applications.

A phosphor in which the M[3] element is La alone seems to have many emission components in the range of 800 nm or more and 850 nm or less, thereby being preferable as a phosphor for near infrared applications.

The M[3] element includes at least La, and the content thereof may preferably satisfy the range of 0.19 at % or more and 7 at % or less. Therefore, it is possible to have the maximum value of the emission peak in the wavelength range of 760 nm or more and 850 nm or less.

The Eu element can preferably be included in an amount of 0.6 at % or more. The upper limit is not particularly necessary as long as the crystal structure is maintained, but the amount may be 13 at % or less, more preferably 12.7 at % or less. If La and Eu are included in the above-mentioned ranges, respectively, it seems that a phosphor thereof has many emission components in the range of 800 nm or more and 850 nm or less, thereby being particularly preferable as a phosphor for near infrared applications.

The inorganic substance may include La of 0.19 at % or more and 7 at % or less, and a phosphor including Eu of 0.6 at % or more is particularly preferable as a phosphor for near infrared applications.

A phosphor in which the inorganic substance is $Eu_2Si_5N_8$: La seems to have many emission components in the range of 800 nm or more and 850 nm or less, thereby being preferable as a phosphor for near infrared applications. Here, the formula $Eu_2Si_5N_8$: La represents a material in which a small amount of La is added (activated) to an $Eu_2Si_5N_8$ crystal, which is a notation generally used for a phosphor.

A phosphor in which the inorganic substance is $Sr_2Si_5N_8$: Eu, La seems to have many emission components in the range of 800 nm or more and 850 nm or less, thereby being preferable as a phosphor for near infrared applications. Here, the formula of $Sr_2Si_5N_8$: Eu, La represents a material in which a small amount of Eu and La are added (activated) to a $Sr_2Si_5N_8$ crystal, which is a notation generally used for a phosphor.

A phosphor in which the inorganic substance is $Ba_2Si_5N_8$: Eu, La seems to have many emission components in the range of 800 nm or more and 850 nm or less, thereby being preferable as a phosphor for near infrared applications. Here, the formula of $Ba_2Si_5N_8$: Eu, La represents a material in which a small amount of Eu and La are added (activated) to a $Ba_2Si_5N_8$ crystal, which is a notation generally used for a phosphor.

In an embodiment of the present invention, when the excitation source is light having a wavelength in the range of 300 nm or more and 600 nm or less, a phosphor has a maximum emission peak value in the wavelength range of 760 nm or more and 850 nm or less, thereby being preferable as a phosphor for near infrared applications. By having the above-mentioned specific composition and crystal structure, the phosphor has a maximum value of an emission peak at a wavelength in the range of 760 nm or more and 850 nm or less.

In an embodiment of the present invention, the phosphor is preferably excited by an excitation source which includes light having a wavelength in the range of 300 nm or more and 600 nm or less and, upon irradiation of the light, the phosphor emits fluorescence exhibiting a spectral shape, in which an emission intensity of a spectrum at a wavelength of 630 nm is equal to or less than one-half (½) of that of a spectrum at a maximum-value wavelength in the range of 760 nm or more and 850 nm or less in an embodiment of the present invention. As a result, the phosphor in the present invention has many emission components in the range of 800 nm or more and 850 nm or less, thereby being preferable as a phosphor for near infrared applications. By having the above-mentioned specific composition and crystal structure, the phosphor which emits fluorescence having such a spectral shape may be obtained.

In an embodiment of the present invention, although the method of manufacturing the phosphor is not particularly specified, the following manufacturing method is exemplified by way of example. The above-mentioned phosphor may be manufactured by mixing a nitride or oxide of the Eu element; a nitride or oxide of the M[3] element; a nitride of the Si element; and if necessary, at least one raw material selected from the group consisting of a nitride or oxide of the M[1] element; a nitride or oxide of the M[2] element; and an oxide of the Si element, and firing the-thus mixed materials at a temperature in the range of 1400° C. or higher and 2200° C. or lower. If the firing temperature is lower than 1400° C., the reaction may not proceed sufficiently such that the emission intensity of the manufactured phosphor may decrease. If the firing temperature is higher than 2200° C., Eu volatilizes, which may reduce the Eu content in the phosphor such that the emission intensity of the phosphor may be reduced. Here, since the M [1] element, the M [2] element, and the M [3] element are as described above, the description thereof will be omitted.

In an embodiment of the present invention, although the application of the phosphor is not particularly specified, a light-emitting element combined with an excitation source is exemplified by way of example. This is a light-emitting element including an excitation source that emits light in the range of 300 nm or more and 600 nm or less, and at least the above-mentioned phosphor. Since such a light-emitting element emits light including near infrared rays of 760 nm or more, thereby being suitable for a lamp that requires a near infrared component.

The above-mentioned excitation source is preferably a light-emitting diode (LED) or a laser diode (LD).

In an embodiment of the present invention, in addition to the phosphor, a light emitting element further comprising one or more other phosphors that emit fluoresce having a maximum value (peak) at a wavelength in the range of 400 nm or more and less than 760 nm upon irradiation by an excitation source has light emission components in the range from the visible region to the near-infrared region, thereby being preferable as a light source for applications where the light from the visible region to the near-infrared region is required.

Each of the one or more other phosphors preferably is preferably selected from the group consisting of α-sialon: Ce, β-sialon: Eu, α-sialon: Eu, $CaAlSiN_3$: Ce, and (Ca, Sr)$AlSiN_3$: Eu. Such a light-emitting element is preferable since it exhibits a high emission intensity in the range of the visible region and near infrared light.

In an embodiment of the present invention, it is preferable that the phosphor and the above-mentioned one or more other phosphors are combined such that the light-emitting element, in an embodiment of the present invention, may have a spectral shape in which a minimum value of the emission intensity is equal to or more than one-fifth (⅕) of a maximum value thereof at a wavelength in the range of 520 nm or more and 850 nm or less. Thus, the light emitting element, in an embodiment of the present invention, can evenly include light from the visible region to the near infrared region.

EXAMPLES

With respect to an embodiment of the present invention, it will be described in more detail with reference to the examples to be shown below, but these examples are disclosed only for the purpose of facilitating understanding in an embodiment of the present invention readily such that the present invention is not limited to these examples.

[Used Raw Materials]

The used raw material powders were a silicon nitride powder (SN-E10 grade, manufactured by Ube Industries, Ltd.) having a specific surface area of 11.2 $m^2$/g, an oxygen content of 1.29 wt %, and an α-type content of 95%; an aluminum nitride powder (E grade, manufactured by Tokuyama Corporation) having a specific surface area of 3.3 $m^2$/g and an oxygen content of 0.82 wt %; lithium nitride (purity 99%, manufactured by Materion Corporation); lanthanum nitride (purity 99%, manufactured by Materion Corporation); europium nitride (purity 99%, manufactured by Materion Corporation); strontium nitride (purity 99%, manufactured by Materion Corporation); barium nitride (purity 99%, manufactured by Materion Corporation); magnesium nitride (purity 99%, manufactured by Materion Corporation); and calcium nitride (purity 99%, manufactured by Materion Corporation).

Examples 1 to 37

Lithium nitride, europium nitride, magnesium nitride, calcium nitride, strontium nitride, barium nitride, aluminum nitride, lanthanum nitride, and silicon nitride powder were used as starting materials. Table 5 shows atomic ratios of the design compositions, Table 6 shows atomic percentages of the compositions, and Table 7 shows parameters of the compositions. According to the design compositions, each mixture was mixed in a glove box having an oxygen content and moisture of 1 ppm or less using a silicon nitride mortar and pestle at the ratios as shown in Table 8, and the thus-mixed powder was placed in a boron nitride crucible. The crucible was set into a graphite resistance heating-type electric furnace. In the firing operation, first, the firing atmosphere was evacuated by a diffusion pump, it was heated from a room temperature to 800° C. at a rate of 500° C. per hour, and nitrogen gas having purity of 99.999 vol % was introduced thereinto at 800° C. such that the pressure was increased up to 0.9 MPa and the temperature was raised up to 1600° C. at 500° C. per hour, and the temperature was maintained for 2 hours. Each of the synthesized samples was ground with the mortar and pestle made of silicon nitride, and a powder X-ray diffraction (XRD) measurement using the Cu Kα characteristic X-ray was conducted. As a result, each sample having all the detected crystal phases exhibited a crystal having the same crystal structure as any one of $Eu_2Si_5N_8$, $Ca_2Si_5N_8$, $Sr_2Si_5N_8$, and $Ba_2Si_5N_8$. The same crystal structure means that the diffraction pattern is the same and the lattice constants are the same or slightly changed by 2% or less.

TABLE 5

Design compositions (atomic ratios) of samples of Examples 1 to 37

| Examples | Li | Eu | Mg | Ca | Sr | Ba | Al | La | Si | N |
|---|---|---|---|---|---|---|---|---|---|---|
| 1 | | 0.1 | | 1.6 | | | 0.3 | 0.3 | 4.7 | 8 |
| 2 | | 1.97 | | | | | | 0.03 | 5 | 8 |
| 3 | | 1.9 | | | | | | 0.1 | 5 | 8 |
| 4 | | 1.7 | | | | | | 0.3 | 5 | 8 |
| 5 | | 1.97 | | | | | 0.03 | 0.03 | 4.97 | 8 |
| 6 | | 1.9 | | | | | 0.1 | 0.1 | 4.9 | 8 |
| 7 | | 1.7 | | | | | 0.3 | 0.3 | 4.7 | 8 |
| 8 | | 1.85 | | | | | | 0.1 | 5 | 8 |
| 9 | | 1.65 | | 0.2 | | | | 0.1 | 5 | 8 |
| 10 | | 1.45 | | 0.4 | | | | 0.1 | 5 | 8 |
| 11 | | 1.05 | | 0.8 | | | | 0.1 | 5 | 8 |
| 12 | | 0.65 | | 1.2 | | | | 0.1 | 5 | 8 |
| 13 | 0.1 | 1.8 | | | | | | 0.1 | 5 | 8 |
| 14 | 0.1 | 1.6 | | 0.2 | | | | 0.1 | 5 | 8 |
| 15 | 0.1 | 1.4 | | 0.4 | | | | 0.1 | 5 | 8 |
| 16 | 0.1 | 1 | | 0.8 | | | | 0.1 | 5 | 8 |
| 17 | 0.1 | 0.6 | | 1.2 | | | | 0.1 | 5 | 8 |
| 18 | | 1.895 | | | | | | 0.07 | 5 | 8 |
| 19 | | 1.775 | | | | | | 0.15 | 5 | 8 |
| 20 | | 1.7 | | | | | | 0.2 | 5 | 8 |
| 21 | 0.1 | | 1.75 | | | | | 0.1 | 5 | 8 |
| 22 | | 1.75 | 0.1 | | | | | 0.1 | 5 | 8 |
| 23 | | 1.65 | 0.2 | | | | | 0.1 | 5 | 8 |
| 24 | | 1.85 | | | | | | 0.1 | 5 | 8 |
| 25 | | 0.25 | | | 1.6 | | | 0.1 | 5 | 8 |
| 26 | | 1.955 | | | | | | 0.03 | 5 | 8 |
| 27 | | 1.91 | | | | | | 0.06 | 5 | 8 |
| 28 | | 1.85 | | | | | | 0.1 | 5 | 8 |
| 29 | | 1.7 | | | | | | 0.2 | 5 | 8 |
| 30 | | 1.4 | | | | | | 0.4 | 5 | 8 |
| 31 | | 0.95 | | | | | | 0.7 | 5 | 8 |
| 32 | | 0.5 | | | | | | 1 | 5 | 8 |
| 33 | | 1.05 | 0.8 | | | | | 0.1 | 5 | 8 |
| 34 | | 1.05 | | 0.8 | | | | 0.1 | 5 | 8 |

TABLE 5-continued

Design compositions (atomic ratios) of samples of Examples 1 to 37

| Examples | Li | Eu | Mg | Ca | Sr | Ba | Al | La | Si | N |
|---|---|---|---|---|---|---|---|---|---|---|
| 35 | | 1.05 | | | 0.8 | | | 0.1 | 5 | 8 |
| 36 | | 1.05 | | | 0.4 | 0.4 | | 0.1 | 5 | 8 |
| 37 | | 0.755 | | | 1.2 | | | 0.03 | 5 | 8 |

TABLE 6

Compositions (atomic %) of samples of Examples 1 to 37

| | Si | M[3] | N | M[1] | M[2] | | | | M[3] | Eu |
|---|---|---|---|---|---|---|---|---|---|---|
| Examples | Si | Al | N | Li | Mg | Ca | Sr | Ba | La | Eu |
| 1 | 31.264 | 1.996 | 53.437 | 0 | 0 | 0 | 10.643 | 0 | 1.996 | 0.665 |
| 2 | 31.915 | 0 | 55.319 | 0 | 0 | 0 | 0 | 0 | 0.191 | 12.574 |
| 3 | 31.915 | 0 | 55.319 | 0 | 0 | 0 | 0 | 0 | 0.638 | 12.128 |
| 4 | 31.915 | 0 | 55.319 | 0 | 0 | 0 | 0 | 0 | 1.915 | 10.851 |
| 5 | 31.744 | 0.192 | 55.291 | 0 | 0 | 0 | 0 | 0 | 0.192 | 12.582 |
| 6 | 31.343 | 0.640 | 55.224 | 0 | 0 | 0 | 0 | 0 | 0.640 | 12.154 |
| 7 | 30.193 | 1.927 | 55.032 | 0 | 0 | 0 | 0 | 0 | 1.927 | 10.921 |
| 8 | 32.120 | 0 | 55.353 | 0 | 0 | 0 | 0 | 0 | 0.642 | 11.884 |
| 9 | 32.258 | 0 | 55.161 | 0 | 0 | 0 | 1.290 | 0 | 0.645 | 10.645 |
| 10 | 32.397 | 0 | 54.968 | 0 | 0 | 0 | 2.592 | 0 | 0.648 | 9.395 |
| 11 | 32.680 | 0 | 54.575 | 0 | 0 | 0 | 5.229 | 0 | 0.654 | 6.863 |
| 12 | 32.967 | 0 | 54.176 | 0 | 0 | 0 | 7.912 | 0 | 0.659 | 4.286 |
| 13 | 32.051 | 0 | 55.128 | 0.641 | 0 | 0 | 0.000 | 0 | 0.641 | 11.538 |
| 14 | 32.189 | 0 | 54.936 | 0.644 | 0 | 0 | 1.288 | 0 | 0.644 | 10.300 |
| 15 | 32.328 | 0 | 54.741 | 0.647 | 0 | 0 | 2.586 | 0 | 0.647 | 9.052 |
| 16 | 32.609 | 0 | 54.348 | 0.652 | 0 | 0 | 5.217 | 0 | 0.652 | 6.522 |
| 17 | 32.895 | 0 | 53.947 | 0.658 | 0 | 0 | 7.895 | 0 | 0.658 | 3.947 |
| 18 | 32.058 | 0 | 55.343 | 0 | 0 | 0 | 0 | 0 | 0.449 | 12.150 |
| 19 | 32.223 | 0 | 55.371 | 0 | 0 | 0 | 0 | 0 | 0.967 | 11.439 |
| 20 | 32.328 | 0 | 55.388 | 0 | 0 | 0 | 0 | 0 | 1.293 | 10.991 |
| 21 | 33.370 | 0 | 53.615 | 0 | 11.680 | 0 | 0 | 0 | 0.667 | 0.667 |
| 22 | 32.189 | 0 | 55.258 | 0 | 0.644 | 0 | 0 | 0 | 0.644 | 11.266 |
| 23 | 32.258 | 0 | 55.161 | 0 | 1.290 | 0 | 0 | 0 | 0.645 | 10.645 |
| 24 | 32.120 | 0 | 55.353 | 0 | 0 | 0 | 0 | 0 | 0.642 | 11.884 |
| 25 | 33.259 | 0 | 53.769 | 0 | 0 | 0 | 10.643 | 0 | 0.665 | 1.663 |
| 26 | 31.976 | 0 | 55.329 | 0 | 0 | 0 | 0 | 0 | 0.192 | 12.503 |
| 27 | 32.038 | 0 | 55.340 | 0 | 0 | 0 | 0 | 0 | 0.384 | 12.238 |
| 28 | 32.120 | 0 | 55.353 | 0 | 0 | 0 | 0 | 0 | 0.642 | 11.884 |
| 29 | 32.328 | 0 | 55.388 | 0 | 0 | 0 | 0 | 0 | 1.293 | 10.991 |
| 30 | 32.751 | 0 | 55.459 | 0 | 0 | 0 | 0 | 0 | 2.620 | 9.170 |
| 31 | 33.408 | 0 | 55.568 | 0 | 0 | 0 | 0 | 0 | 4.677 | 6.347 |
| 32 | 34.091 | 0 | 55.682 | 0 | 0 | 0 | 0 | 0 | 6.818 | 3.409 |
| 33 | 32.680 | 0 | 54.575 | 0 | 5.229 | 0 | 0 | 0 | 0.654 | 6.863 |
| 34 | 32.680 | 0 | 54.575 | 0 | 0 | 5.229 | 0 | 0 | 0.654 | 6.863 |
| 35 | 32.680 | 0 | 54.575 | 0 | 0 | 0 | 0 | 5.229 | 0.654 | 6.863 |
| 36 | 32.680 | 0 | 54.575 | 0 | 0 | 0 | 2.614 | 2.614 | 0.654 | 6.863 |
| 37 | 32.816 | 0 | 54.157 | 0 | 0 | 0 | 7.876 | 0 | 0.197 | 4.955 |

TABLE 7

Parameters (atomic ratios) of samples of Examples 1 to 37

| Examples | M[1] a | Eu b | M[2] c | M[3] d | Si e | O f | N g |
|---|---|---|---|---|---|---|---|
| 1 | 0 | 0.0067 | 0.1064 | 0.0399 | 0.313 | 0 | 0.534 |
| 2 | 0 | 0.1257 | 0 | 0.0019 | 0.319 | 0 | 0.553 |
| 3 | 0 | 0.1213 | 0 | 0.0064 | 0.319 | 0 | 0.553 |
| 4 | 0 | 0.1085 | 0 | 0.0191 | 0.319 | 0 | 0.553 |
| 5 | 0 | 0.1258 | 0 | 0.0038 | 0.317 | 0 | 0.553 |
| 6 | 0 | 0.1215 | 0 | 0.0128 | 0.313 | 0 | 0.552 |
| 7 | 0 | 0.1092 | 0 | 0.0385 | 0.302 | 0 | 0.550 |
| 8 | 0 | 0.1188 | 0 | 0.0064 | 0.321 | 0 | 0.554 |
| 9 | 0 | 0.1065 | 0.0129 | 0.0065 | 0.323 | 0 | 0.552 |
| 10 | 0 | 0.0940 | 0.0259 | 0.0065 | 0.324 | 0 | 0.550 |
| 11 | 0 | 0.0686 | 0.0523 | 0.0065 | 0.327 | 0 | 0.546 |
| 12 | 0 | 0.0429 | 0.0791 | 0.0066 | 0.330 | 0 | 0.542 |
| 13 | 0.0064 | 0.1154 | 0 | 0.0064 | 0.321 | 0 | 0.551 |
| 14 | 0.0064 | 0.1030 | 0.0129 | 0.0064 | 0.322 | 0 | 0.549 |
| 15 | 0.0065 | 0.0905 | 0.0259 | 0.0065 | 0.323 | 0 | 0.547 |
| 16 | 0.0065 | 0.0652 | 0.0522 | 0.0065 | 0.326 | 0 | 0.543 |
| 17 | 0.0066 | 0.0395 | 0.0789 | 0.0066 | 0.329 | 0 | 0.539 |
| 18 | 0 | 0.1215 | 0 | 0.0045 | 0.321 | 0 | 0.553 |
| 19 | 0 | 0.1144 | 0 | 0.0097 | 0.322 | 0 | 0.554 |
| 20 | 0 | 0.1099 | 0 | 0.0129 | 0.323 | 0 | 0.554 |
| 21 | 0 | 0.0067 | 0.1168 | 0.0067 | 0.334 | 0 | 0.536 |
| 22 | 0 | 0.1127 | 0.0064 | 0.0064 | 0.322 | 0 | 0.553 |
| 23 | 0 | 0.1065 | 0.0129 | 0.0065 | 0.323 | 0 | 0.552 |
| 24 | 0 | 0.1188 | 0 | 0.0064 | 0.321 | 0 | 0.554 |
| 25 | 0 | 0.0166 | 0.1064 | 0.0067 | 0.333 | 0 | 0.538 |
| 26 | 0 | 0.1250 | 0 | 0.0019 | 0.320 | 0 | 0.553 |
| 27 | 0 | 0.1224 | 0 | 0.0038 | 0.320 | 0 | 0.553 |
| 28 | 0 | 0.1188 | 0 | 0.0064 | 0.321 | 0 | 0.554 |
| 29 | 0 | 0.1099 | 0 | 0.0129 | 0.323 | 0 | 0.554 |
| 30 | 0 | 0.0917 | 0 | 0.0262 | 0.328 | 0 | 0.555 |

TABLE 7-continued

Parameters (atomic ratios) of samples of Examples 1 to 37

| Examples | M[1] a | Eu b | M[2] c | M[3] d | Si e | O f | N g |
|---|---|---|---|---|---|---|---|
| 31 | 0 | 0.0635 | 0 | 0.0468 | 0.334 | 0 | 0.556 |
| 32 | 0 | 0.0341 | 0 | 0.0682 | 0.341 | 0 | 0.557 |
| 33 | 0 | 0.0686 | 0.0523 | 0.0065 | 0.327 | 0 | 0.546 |
| 34 | 0 | 0.0686 | 0.0523 | 0.0065 | 0.327 | 0 | 0.546 |
| 35 | 0 | 0.0686 | 0.0523 | 0.0065 | 0.327 | 0 | 0.546 |
| 36 | 0 | 0.0686 | 0.0523 | 0.0065 | 0.327 | 0 | 0.546 |
| 37 | 0 | 0.0496 | 0.0788 | 0.0020 | 0.328 | 0 | 0.542 |

TABLE 8

Mixture compositions (mole ratios) of raw materials of Examples 1 to 37

| Examples | Si3N4 | AlN | Li3N | Mg3N2 | Ca3N2 | Sr3N2 | Ba3N2 | LaN | EuN |
|---|---|---|---|---|---|---|---|---|---|
| 1 | 1.567 | 0.300 | | | | 0.533 | | 0.300 | 0.100 |
| 2 | 1.667 | | | | | | | 0.030 | 1.970 |
| 3 | 1.667 | | | | | | | 0.100 | 1.900 |
| 4 | 1.667 | | | | | | | 0.300 | 1.700 |
| 5 | 1.657 | 0.030 | | | | | | 0.030 | 1.970 |
| 6 | 1.633 | 0.100 | | | | | | 0.100 | 1.900 |
| 7 | 1.567 | 0.300 | | | | | | 0.300 | 1.700 |
| 8 | 1.667 | | | | | | | 0.100 | 1.850 |
| 9 | 1.667 | | | | | 0.067 | | 0.100 | 1.650 |
| 10 | 1.667 | | | | | 0.133 | | 0.100 | 1.450 |
| 11 | 1.667 | | | | | 0.267 | | 0.100 | 1.050 |
| 12 | 1.667 | | | | | 0.400 | | 0.100 | 0.650 |
| 13 | 1.667 | | 0.033 | | | 0.000 | | 0.100 | 1.800 |
| 14 | 1.667 | | 0.033 | | | 0.067 | | 0.100 | 1.600 |
| 15 | 1.667 | | 0.033 | | | 0.133 | | 0.100 | 1.400 |
| 16 | 1.667 | | 0.033 | | | 0.267 | | 0.100 | 1.000 |
| 17 | 1.667 | | 0.033 | | | 0.400 | | 0.100 | 0.600 |
| 18 | 1.667 | | | | | | | 0.070 | 1.895 |
| 19 | 1.667 | | | | | | | 0.150 | 1.775 |
| 20 | 1.667 | | | | | | | 0.200 | 1.700 |
| 21 | 1.667 | | | 0.583 | | | | 0.100 | 0.100 |
| 22 | 1.667 | | | 0.033 | | | | 0.100 | 1.750 |
| 23 | 1.667 | | | 0.067 | | | | 0.100 | 1.650 |
| 24 | 1.667 | | | | | | | 0.100 | 1.850 |
| 25 | 1.667 | | | | | 0.533 | | 0.100 | 0.250 |
| 26 | 1.667 | | | | | | | 0.030 | 1.955 |
| 27 | 1.667 | | | | | | | 0.060 | 1.910 |
| 28 | 1.667 | | | | | | | 0.100 | 1.850 |
| 29 | 1.667 | | | | | | | 0.200 | 1.700 |
| 30 | 1.667 | | | | | | | 0.400 | 1.400 |
| 31 | 1.667 | | | | | | | 0.700 | 0.950 |
| 32 | 1.667 | | | | | | | 1.000 | 0.500 |
| 33 | 1.667 | | | 0.267 | | | | 0.100 | 1.050 |
| 34 | 1.667 | | | | 0.267 | | | 0.100 | 1.050 |
| 35 | 1.667 | | | | | | 0.267 | 0.100 | 1.050 |
| 36 | 1.667 | | | | | 0.133 | 0.133 | 0.100 | 1.050 |
| 37 | 1.667 | | | | | 0.400 | | 0.030 | 0.755 |

The excitation spectra and emission spectra of the synthesized powders were measured using an FP-8600 Fluorescence Spectrometer manufactured by JASCO Corporation. The maximum emission wavelength was obtained from the emission spectrum. The results are summarized in Table 9.

TABLE 9

Emission characteristics of samples of Examples 1 to 37

| Examples | Peak wavelength (nm) | Emission intensity (arbitrary unit) |
|---|---|---|
| 1 | 798 | 0.2 |
| 2 | 799 | 0.39 |
| 3 | 815 | 0.42 |
| 4 | 817 | 0.34 |
| 5 | 801 | 0.16 |
| 6 | 825 | 0.21 |
| 7 | 833 | 0.12 |
| 8 | 808 | 0.42 |
| 9 | 810 | 0.41 |
| 10 | 798 | 0.43 |
| 11 | 796 | 0.42 |
| 12 | 796 | 0.45 |
| 13 | 802 | 0.42 |
| 14 | 802 | 0.41 |
| 15 | 797 | 0.41 |
| 16 | 797 | 0.45 |
| 17 | 781 | 0.45 |
| 18 | 808 | 0.44 |
| 19 | 812 | 0.39 |
| 20 | 818 | 0.34 |
| 21 | 800 | 0.02 |
| 22 | 808 | 0.36 |
| 23 | 811 | 0.35 |
| 24 | 813 | 0.38 |
| 25 | 771 | 0.38 |

TABLE 9-continued

Emission characteristics of samples of Examples 1 to 37

| Examples | Peak wavelength (nm) | Emission intensity (arbitrary unit) |
|---|---|---|
| 26 | 790 | 0.44 |
| 27 | 801 | 0.43 |
| 28 | 806 | 0.4 |
| 29 | 812 | 0.33 |
| 30 | 824 | 0.25 |
| 31 | 825 | 0.24 |
| 32 | 827 | 0.19 |
| 33 | 801 | 0.31 |
| 34 | 809 | 0.3 |
| 35 | 811 | 0.34 |
| 36 | 801 | 0.35 |
| 37 | 767 | 0.43 |

Figure 5:
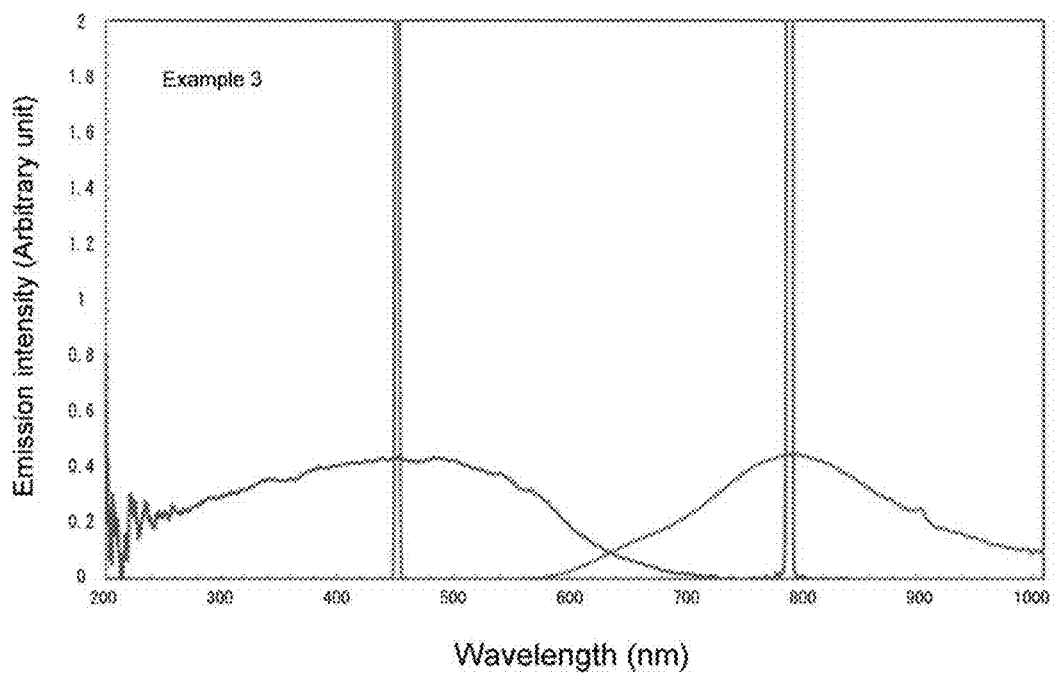
FIG. 5 is a diagram showing excitation and emission spectra of a powder of Example 3.

FIG. 5 is a diagram showing excitation and emission spectra by the powder of Example 3.

Figure 6:
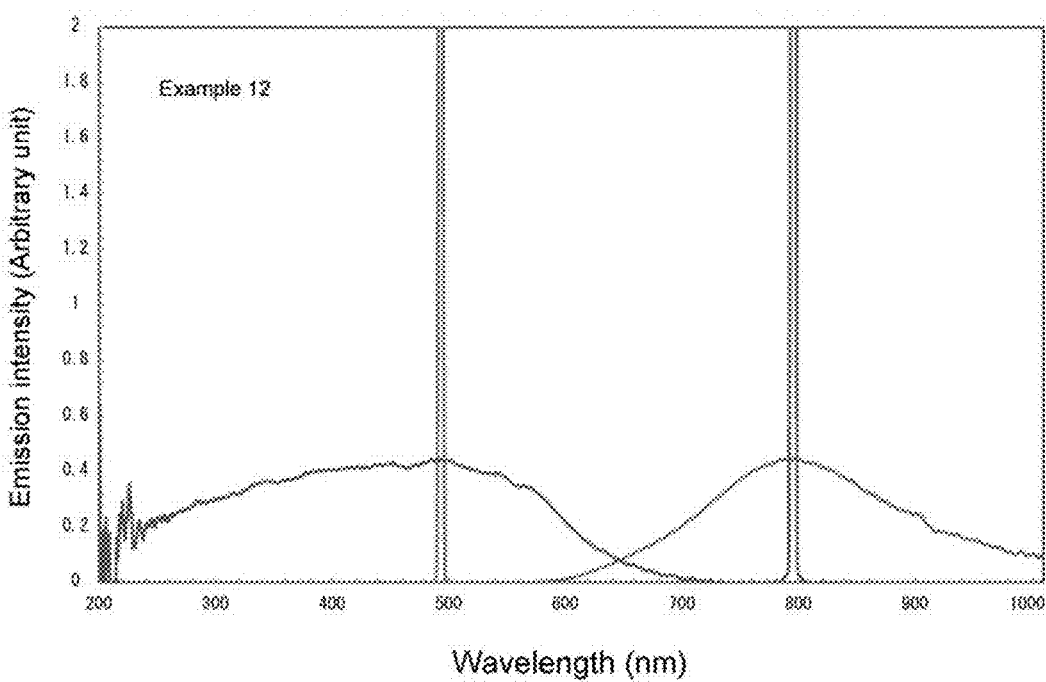
FIG. 6 is a diagram showing excitation and emission spectra of a powder of Example 12.

FIG. 6 is a diagram showing excitation and emission spectra by the powder of Example 12.

Figure 7:
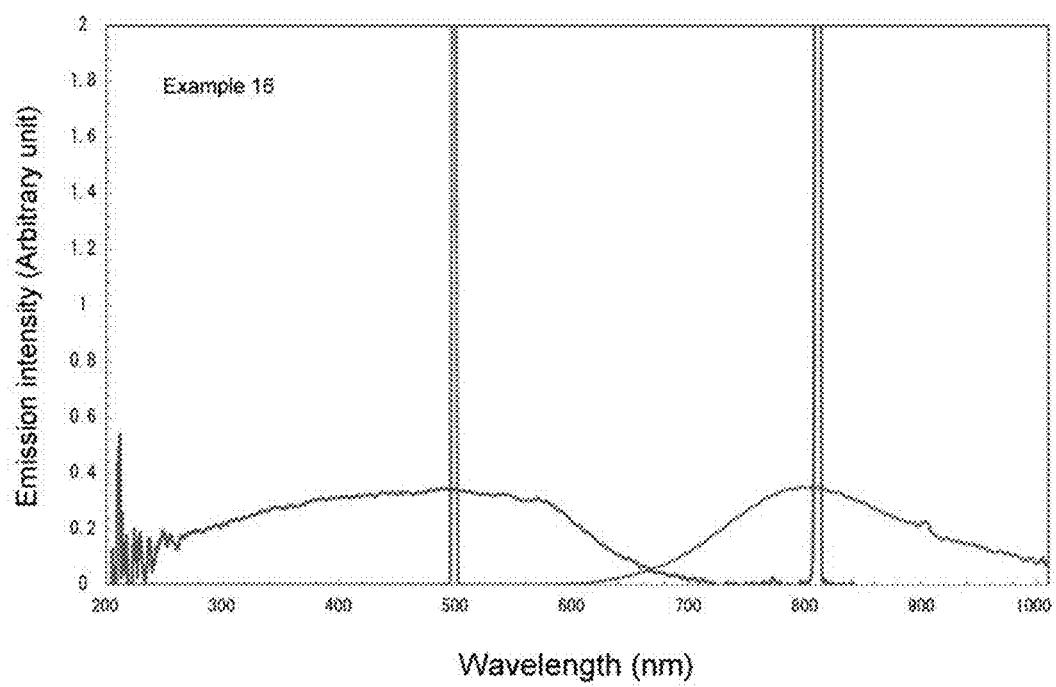
FIG. 7 is a diagram showing excitation and emission spectra of a powder of Example 16.

FIG. 7 is a diagram showing excitation and emission spectra by the powder of Example 16.

Figure 8:
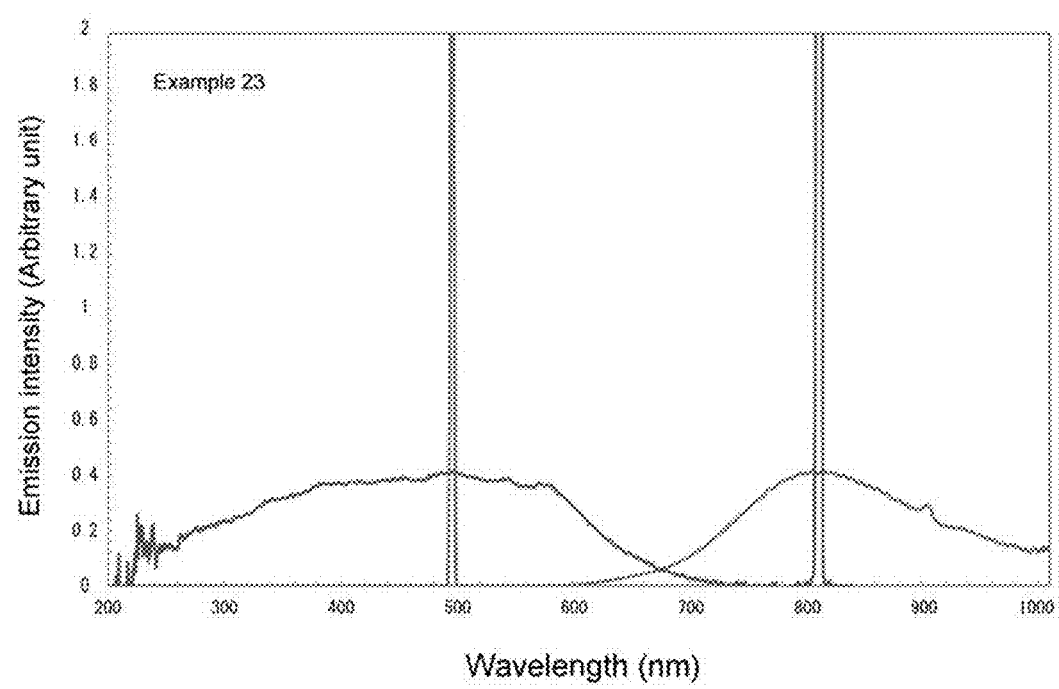
FIG. 8 is a diagram showing excitation and emission spectra of a powder of Example 23.

FIG. 8 is a diagram showing excitation and emission spectra by the powder of Example 23.

In the figures, the peak having an intensity reaching 2 is not considered as the emission peak because it shows that the direct light was detected at the time of measurement so as not to be the emission from the material. It was confirmed that a powder of any one of the examples was a phosphor to emit near-infrared light, more specifically, light having a maximum emission wavelength in the range from 760 nm to 850 nm upon irradiation of visible light or ultraviolet rays. Further, it was confirmed that a powder of any one of the examples emitted fluorescence having a spectral shape in which the emission intensity at 630 nm was equal to or less than one-half (½) of that of the maximum value wavelength in the range of 760 nm or more and 850 nm or less.

Comparative Examples 1 to 9

The powders of Comparative Examples 1 to 9 were synthesized by the same method as used in Examples 1 to 37 in accordance with the design parameters as shown in Tables 10 to 12.

TABLE 10

Design compositions (atomic ratios) of samples of Comparative examples 1 to 9

| Comparative examples | Li | Eu | Mg | Ca | Sr | Ba | Al | La | Si | N |
|---|---|---|---|---|---|---|---|---|---|---|
| 1 |  | 0.05 |  |  | 1.8 |  |  | 0.1 | 5 | 8 |
| 2 |  | 0.01 |  |  | 1.84 |  |  | 0.1 | 5 | 8 |
| 3 |  | 0 |  |  | 1.85 |  |  | 0.1 | 5 | 8 |
| 4 |  | 2 |  |  |  |  |  |  | 5 | 8 |
| 5 |  | 1.999 |  |  |  |  |  | 0.001 | 5 | 8 |
| 6 |  | 1.996 |  |  |  |  |  | 0.003 | 5 | 8 |
| 7 |  | 1.985 |  |  |  |  |  | 0.01 | 5 | 8 |
| 8 |  | 0.8 |  |  | 1.2 |  |  |  | 5 | 8 |
| 9 |  | 0.785 |  |  | 1.2 |  |  | 0.01 | 5 | 8 |

TABLE 11

Compositions (atomic ratios) of samples of Comparative examples 1 to 9

| Comparative examples | Si | Al | N | Li | Mg | Ca | Sr | Ba | La | Eu |
|---|---|---|---|---|---|---|---|---|---|---|
| 1 | 33.408 | 0 | 53.563 | 0 | 0 | 0 | 12.027 | 0 | 0.668 | 0.334 |
| 2 | 33.437 | 0 | 53.522 | 0 | 0 | 0 | 12.305 | 0 | 0.669 | 0.067 |
| 3 | 33.445 | 0 | 53.512 | 0 | 0 | 0 | 12.375 | 0 | 0.669 | 0 |
| 4 | 31.915 | 0 | 55.319 | 0 | 0 | 0 | 0 | 0 | 0 | 12.766 |
| 5 | 31.917 | 0 | 55.319 | 0 | 0 | 0 | 0 | 0 | 0.006 | 12.757 |
| 6 | 31.921 | 0 | 55.320 | 0 | 0 | 0 | 0 | 0 | 0.019 | 12.740 |
| 7 | 31.935 | 0 | 55.323 | 0 | 0 | 0 | 0 | 0 | 0.064 | 12.678 |
| 8 | 32.751 | 0 | 54.148 | 0 | 0 | 0 | 7.860 | 0 | 0 | 5.240 |
| 9 | 32.773 | 0 | 54.151 | 0 | 0 | 0 | 7.865 | 0 | 0.066 | 5.145 |

TABLE 12

Parameters (atomic ratios) of samples of Comparative examples 1 to 9

| Comparative examples | M[1] a | Eu b | M[2] c | M[3] d | Si e | O f | N g |
|---|---|---|---|---|---|---|---|
| 1 | 0 | 0.0033 | 0.1203 | 0.0067 | 0.334 | 0 | 0.536 |
| 2 | 0 | 0.0007 | 0.1230 | 0.0067 | 0.334 | 0 | 0.535 |
| 3 | 0 | 0 | 0.1237 | 0.0067 | 0.334 | 0 | 0.535 |
| 4 | 0 | 0.1277 | 0 | 0 | 0.319 | 0 | 0.553 |
| 5 | 0 | 0.1276 | 0 | 0.0001 | 0.319 | 0 | 0.553 |
| 6 | 0 | 0.1274 | 0 | 0.0002 | 0.319 | 0 | 0.553 |
| 7 | 0 | 0.1268 | 0 | 0.0006 | 0.319 | 0 | 0.553 |
| 8 | 0 | 0.0524 | 0.0786 | 0 | 0.328 | 0 | 0.542 |
| 9 | 0 | 0.0515 | 0.0787 | 0.0007 | 0.328 | 0 | 0.542 |

The synthesized powders were identified by XRD in the same way as used with respect to Examples 1 to 37 such that any one of the detected crystal phases was a crystal having the same crystal structure as either $Eu_2Si_5N_8$ and $Sr_2Si_5N_8$. Further, the excitation spectra and the emission spectra of the synthesized powders were measured in the same way as in Examples 1 to 37, and the emission characteristics thereof are shown in FIGS. 9, 10 and 13.

Figure 9:
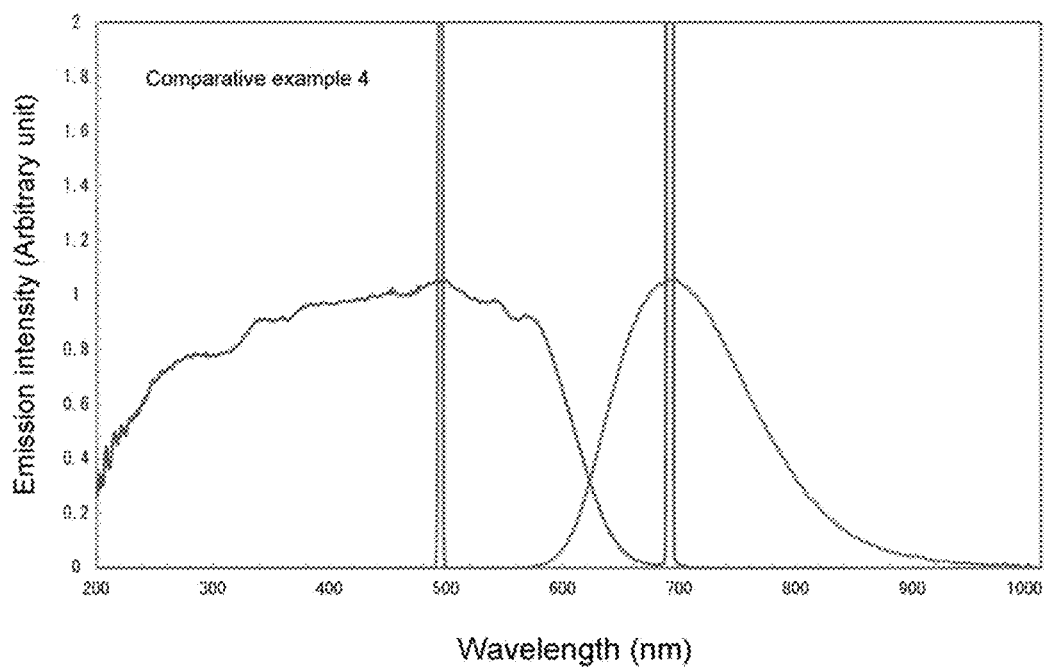
FIG. 9 is a diagram showing excitation and emission spectra of a powder of Comparative Example 4.

FIG. 9 is a diagram showing excitation and emission spectra of the powder of Comparative Example 4.

Figure 10:
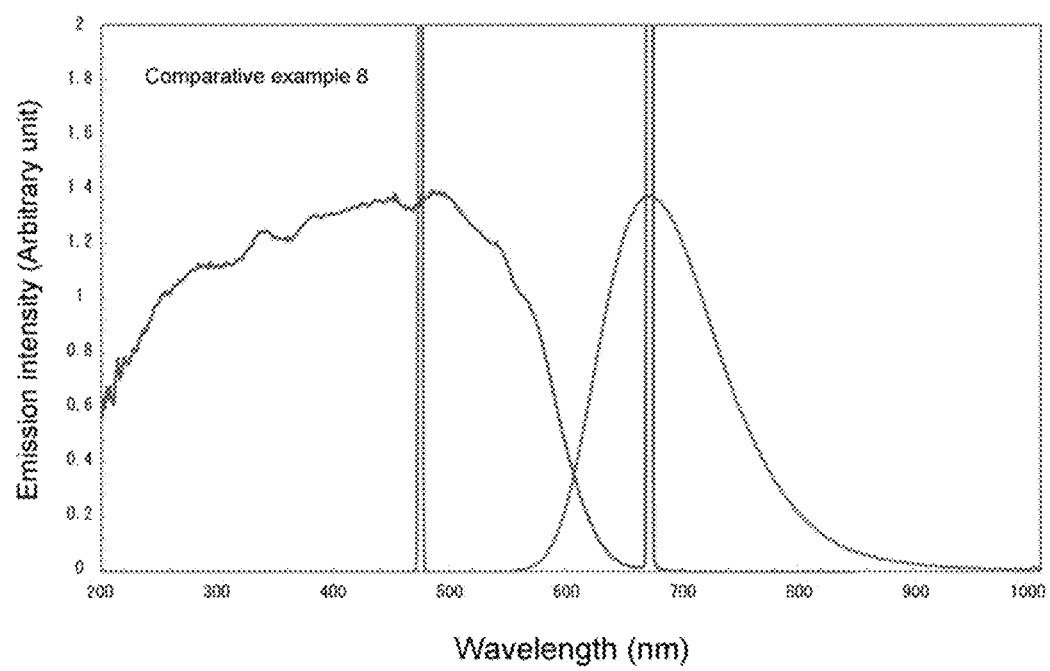
FIG. 10 is a diagram showing excitation and emission spectra of a powder of Comparative Example 8.

FIG. 10 is a diagram showing excitation and emission spectra of the powder of Comparative Example 8.

According to FIG. 9, the emission peak wavelength of the powder of Comparative Example 4 of a pure $Eu_2Si_5N_8$ was 696 nm. According to FIG. 10, the emission peak wavelength of Comparative Example 8 of $Sr_2Si_5N_8$: Eu not including any of La was 674 nm. Further, as shown in Table 13, it was found that none of Comparative Examples 1 to 9 satisfying the above-mentioned compositions (parameters) had any local maximum values of the emission peaks at a wavelength in the range of 760 nm or more and 850 nm or less. Specifically, any one of the emission peak wavelengths of the powders of Comparative Examples 4 to 9 having the La content of less than 0.19 at % was less than 700 nm. Any one of the emission peak wavelengths of the powders of Comparative Examples 1 to 3 having the Eu content of 0.6 at % or less was also less than 700 nm.

TABLE 13

Emission characteristices of samples of Comparative examples 1 to 9

| Comparative examples | Paek wavelength (nm) | Emission intensity (arbitrary unit) |
| --- | --- | --- |
| 1 | 625 | 0.89 |
| 2 | 618 | 0.88 |
| 3 | 614 | 0.34 |
| 4 | 696 | 1.06 |
| 5 | 697 | 0.9 |
| 6 | 694 | 0.78 |
| 7 | 722 | 0.51 |
| 8 | 674 | 1.38 |
| 9 | 676 | 0.84 |

Example of Light-Emitting Device; Example 38

Next, a light emitting device was manufactured using the phosphor in an embodiment of the present invention.

Figure 11:
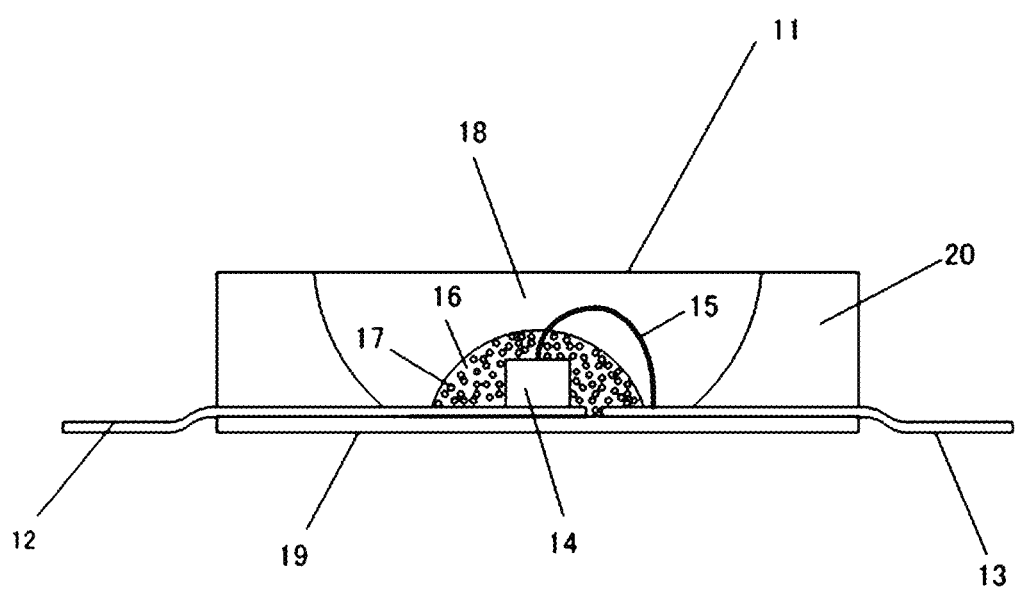
FIG. 11 is a schematic view illustrating a light-emitting device in an embodiment of the present invention.

FIG. 11 is a schematic view showing the light-emitting device in an embodiment of the present invention.

FIG. 11 shows a chip-type of infrared light-emitting diode lamp (11) for board-mounting as a light emitting device. Two lead wires (12, 13) are fixed to a white alumina ceramic board (19) having high reflectance of visible light and one end of each of the wires is located at approximately the center portion of the board and the other end of each of the wires extends outside to serve as an electrode to be soldered when the lamp is mounted on the electric board. One of the lead wires (12) has the one end on which an blue light-emitting diode element (14) having an emission peak wavelength of 450 nm is placed and fixed thereto such that the element is located at the center of the board. The lower electrode of the blue light-emitting diode element (14) and the lead wire below are electrically connected with conductive paste, and the upper electrode and the other lead wire (13) are electrically connected to a gold thin wire (15).

The first resin (16) and a phosphor synthesized in Example 1 are mounted in the vicinity of the light-emitting diode device. The first resin in which this phosphor is dispersed is transparent, and covers the entire blue light-emitting diode element (14). Also, a wall surface member (20) having a hole opened at the center portion is fixed to the ceramic board. The wall surface member (20) has the center portion formed as the hole in which the blue light-emitting diode element (14) and the resin (16) having the phosphor (17) dispersed therein are contained and the portion of the hole facing the center is made to be a slope. This slope is a reflective surface for taking out light forward, and the shape of the curved surface of the slope is determined in consideration of the direction of light reflection. Further, at least the surface which constitutes the reflective surface forms a surface having high visible light reflectance with white color or metallic luster. In the present example, the wall surface member (20) is configured with white silicone resin. The hole at the center portion of the wall surface member is formed with a recess as the final shape of the chip-type light-emitting diode lamp, and is filled up with second transparent resin (18) to seal all of the blue light-emitting diode element (14) and the first resin (16) in which the phosphor (17) is dispersed. In the present example, the same epoxy resin was used for both the first resin (16) and second resin (18).

Example of Light-Emitting Device; Example 39

A chip-type white and near-infrared light-emitting diode lamp (11) for board-mounting was manufactured. Two lead wires (12, 13) are fixed to a white alumina ceramic board (19) having high reflectance of visible light and one end of each of the wires is located at approximately the center portion of the board and the other end of each of the wires extends outside to serve as an electrode to be soldered when the lamp is mounted on the electric board. One of the lead wires (12) has the one end on which a blue light-emitting diode element (14) having an emission peak wavelength of 450 nm is placed and fixed thereto such that the element is located at the center of the board. The lower electrode of the blue light-emitting diode element (14) and the lead wire below are electrically connected with conductive paste, and the upper electrode and the other lead wire (13) are electrically connected to a gold thin wire (15).

A mixture prepared by mixing the first resin (16), a phosphor prepared for Example 1, a green phosphor in which Eu is added to β-sialon crystal, a yellow phosphor in which Eu is added to α-sialon, and a red phosphor in which Eu is added to $CaAlSiN_3$ crystal is mounted in the vicinity of the light-emitting diode element. The first resin in which these phosphors are dispersed is transparent, and covers the entire blue light-emitting diode element (14). Also, a wall surface member (20) having a hole opened at the center portion is fixed to the ceramic board. The wall surface member (20) has the center portion formed as the hole in which the blue light-emitting diode element (14) and the resin (16) having the phosphors (17) dispersed therein are contained and the portion of the hole facing the center is made to be a slope. This slope is a reflective surface for taking out light forward, and the shape of the curved surface of the slope is determined in consideration of the direction of light reflection. Further, at least the surface which constitutes the reflective surface forms a surface having high visible light reflectance with white color or metallic luster. In the present example, the wall surface member (20) is configured with white silicone resin. In this way, a light-emitting device that emits light from visible to near-infrared light was obtained.

INDUSTRIAL APPLICABILITY

In an embodiment of the present invention, the nitride phosphor emits fluorescence of near-infrared ray having a longer emission wavelength than that of a prior phosphor activated by Eu, which is more than 760 nm. In the future, it is expected that a component of the near-infrared light will be greatly utilized in a necessary light source, which will contribute to the development of industry.

EXPLANATION OF NUMERALS 11 chip-type white light-emitting diode lamp for board-mounting.
12,13 lead wire.
14 light-emitting diode element.
15 bonding wire.
16, 18 resin.
17 phosphor.
19 alumina ceramic board.
20 wall surface member.

What is claimed is:

1. A phosphor comprising an inorganic substance comprising an Eu element, an M[3] element (M[3] is at least one kind of element selected from a group consisting of Al, Y, La, and Gd), a Si element, a nitrogen element, and, if necessary, at least one kind of element selected from a group consisting of an M[1] element (M[1] is a Li element), an M[2] element (M[2] is at least one kind of element selected from a group consisting of Mg, Ca, Ba, and Sr), and an oxygen element, wherein the inorganic substance is represented by a composition of $M[1]_a Eu_b M[2]_c M[3]_d Si_e O_f N_g$ (where $a+b+c+d+e+f+g=1$) wherein parameters a, b, c, d, e, f, and g are represented by values respectively satisfying:
$0 \leq a \leq 0.01$,
$0.006 \leq b \leq 0.15$,
$0 \leq c \leq 0.15$,
$0.001 \leq d \leq 0.07$,
$0.3 \leq e \leq 0.35$,
$0 \leq f \leq 0.05$, and
$0.5 \leq g \leq 0.56$;

the phosphor emitting light having a local maximum value of a emission peak at a wavelength in a range of 760 nm or more and 850 nm or less upon irradiation by an excitation source.

2. The phosphor according to claim 1 wherein the inorganic substance is represented by a composition of $M[1]_a Eu_b M[2]_c M[3]_d Si_e O_f N_g$ (where $a+b+c+d+e+f+g=1$) wherein parameters a, b, c, d, e, f, and g are represented by values respectively satisfying:
$a=0$
$0.006 \leq b \leq 0.13$,
$0 \leq c \leq 0.12$,
$0.0019 \leq d \leq 0.07$,
$0.3 \leq e \leq 0.35$,
$f=0$, and
$0.53 \leq g \leq 0.56$.

3. The phosphor according to claim 1 wherein the inorganic substance is represented by a composition of $(Eu, M[2])_x M[3]_y Si_5 N_8$ where $x=2-1.5y$ and $0.1 \leq y \leq 0.5$.

4. The phosphor according to claim 1 wherein the inorganic substance has the same crystal structure as any one of $Eu_2Si_5N_8$, $Ca_2Si_5N_8$, $Sr_2Si_5N_8$, and $Ba_2Si_5N_8$.

5. The phosphor according to claim 1 wherein the M[2] element is not included.

6. The phosphor according to claim 1 wherein the M[3] element is La single metal.

7. The phosphor according to claim 1 wherein the M[3] comprises at least La, and the La is contained in the range of 0.19 at % or more to 7 at % or less.

8. The phosphor according to claim 1 wherein the Eu element is contained in an amount of 0.6 at % or more.

9. The phosphor according to claim 1 wherein the inorganic substance is represented by $Eu_2Si_5N_8$: La.

10. The phosphor according to claim 1 wherein the inorganic substance is represented by $Sr_2Si_5N_8$: Eu, La.

11. The phosphor according to claim 1 wherein the inorganic substance is represented by $Ba_2Si_5N_8$: Eu, La.

12. The phosphor according to claim 1 wherein the excitation source is light having a wavelength in a range of 300 nm or more and 600 nm or less.

13. The phosphor according to claim 1 wherein the excitation source is light having a wavelength thereof in a range of 300 nm or more and 600 nm or less, the phosphor emitting fluorescence having a spectral shape in which an emission intensity at 630 nm upon irradiation by the light is equal to or less than one-half of an emission intensity of a maximum value wavelength in a range of 760 nm or more and 850 nm or less.

14. A method of manufacturing a phosphor as recited in claim 1 comprising the steps of:
mixing a nitride or an oxide of Eu element, a nitride or an oxide of M[3] element, a nitride of Si element, and, if necessary, an at least one raw material selected from a group consisting of a nitride or an oxide of M[1], a nitride or an oxide of M[2], and an oxide of Si element; and
firing a mixed mixture at a temperature in a range of 1400° C. or higher and 2200° or lower.

15. A light-emitting element comprising: an excitation source and a phosphor,
wherein the excitation source emits light having a wavelength in a range of 300 nm or more and 600 nm or less and
wherein the phosphor comprises at least a phosphor as recited in claim 1.

16. The light-emitting element according to claim 15 wherein the excitation source is a light emitting diode (LED) or a laser diode (LD).

17. The light-emitting element according to claim 15 further comprising one or more other phosphors emitting fluorescence having a maximum value (peak) at a wavelength in a range of 400 nm or more and 760 nm or less upon irradiation by the excitation source.

18. The light-emitting element according to claim 17 wherein the one or more other phosphors are respectively selected from a group consisting of α-sialon: Ce, β-sialon: Eu, α-sialon: Eu, $CaAlSiN_3$: Ce, and $(Ca, Sr)AlSiN_3$: Eu.

19. The light-emitting element according to claim 17 wherein the fluorescence has a spectral shape in which a minimum value of an emission intensity thereof is at least one-fifth (⅕) of a maximum value thereof in a wavelength range of 520 nm or more and 850 nm or less.

* * * * *